United States Patent [19]

Raikaa

[11] Patent Number: 5,625,326

[45] Date of Patent: Apr. 29, 1997

[54] LOCK ALARM CIRCUIT OF A SYNTHESIZER

[75] Inventor: Olli-Pekka Raikaa, Irving, Tex.

[73] Assignee: Nokia Telecommunications OY, Espoo, Finland

[21] Appl. No.: 656,316

[22] PCT Filed: Oct. 11, 1995

[86] PCT No.: PCT/FI95/00564

§ 371 Date: Jun. 12, 1996

§ 102(e) Date: Jun. 12, 1996

[87] PCT Pub. No.: WO96/12348

PCT Pub. Date: Apr. 25, 1996

[30] Foreign Application Priority Data

Oct. 14, 1994 [FI] Finland .................... 944856

[51] Int. Cl.$^6$ .................... H03L 7/06; H03L 7/095
[52] U.S. Cl. .................... 331/64; 331/8; 331/173; 331/DIG. 2
[58] Field of Search .................... 331/1 A, 4, 8, 331/14–16, 25, 64, 173, DIG. 2; 327/105, 107, 142, 143, 156–159; 375/376; 455/260

[56] References Cited

U.S. PATENT DOCUMENTS

| | | | |
|---|---|---|---|
| 4,135,165 | 1/1979 | Coe | 331/11 |
| 4,330,758 | 5/1982 | Swisher et al. | 331/1 |
| 4,499,434 | 2/1985 | Thompson | 331/17 |
| 5,304,953 | 4/1994 | Heim et al. | 331/1 A |
| 5,319,798 | 6/1994 | Watanabe | 331/64 X |

FOREIGN PATENT DOCUMENTS

| | | |
|---|---|---|
| 0380946 | 8/1990 | European Pat. Off. . |
| 0484158 | 5/1992 | European Pat. Off. . |
| 0484097 | 5/1992 | European Pat. Off. . |

OTHER PUBLICATIONS

Patent Abstracts of Japan, vol. 14, No. 168, E-912, Abstract of JP, A, 2–25112 (Matsushita Electric Ind Co Ltd), 26 Jan. 1990, Michio Tsuneoka.

*Primary Examiner*—David Mis
*Attorney, Agent, or Firm*—Cushman Darby & Cushman IP Group of Pillsbury Madison & Sutro LLP

[57] ABSTRACT

A signal of a locking detector of a synthesizer indicates in a first state that a loop is locked, and in a second state that the loop is unlocked. The synthesizer may be temporarily deactivated by switching off the operating voltage of a voltage controlled oscillator by means of a switching signal. The alarm circuit of the synthesizer includes a first detector, a state of the output of which changes with a delay, in response to the change of the signal of the detector conveyed to the detector, and a second detector, the state of the output of which changes with a delay, in response to the change of the switching signal conveyed to the detector, and a device generating the alarm signal. The device provides the output signal of the alarm circuit in response to the output signals of the detectors. By selecting appropriate delay-times for the detector, it is possible to achieve the intended operation.

7 Claims, 3 Drawing Sheets

LOCK ALARM CIRCUIT OF A SYNTHESIZER

This application claims benefit of international application PCT/FI95/00564 filed Oct. 11, 1995.

This invention relates to a lock alarm circuit of such a synthesizer comprising a locking detector and allowing deactivating of the synthesizer by switching off the operating voltage from a voltage controlled oscillator and buffers.

A synthesizer generally comprises a controllable phase locked loop PLL. A PLL comprises a voltage-controlled oscillator VCO, a phase detector and a low-pass filter. A reference frequency signal is applied to a first input of the phase detector, and the feedback output signal of the oscillator, providing also an output signal for the loop, is applied to a second input of the phase detector. In numerous applications, such as frequency synthesizers, the feedback branch is equipped with is a loop divider, the division ratio of which may be changed by means of software. The frequency of the output signal is thus divided prior to applying it to the phase detector, which allows forming frequencies which are significantly higher than the reference frequency, yet bound to it.

The phase detector detects a phase difference between the input signals and generates an output signal which is proportional to the phase difference, and applied to a low-pass filter which acts as a loop filter. Its output voltage, in turn, provides the control voltage for the voltage-controlled oscillator. When the loop is in balance, the phase of an output frequency signal is locked onto the phase of a reference frequency signal.

The phase lock must be designed so as to maintain its balance and prevent the output signal from modulating despite rapid fluctuation, such as jitter, occurring in either of the input signals, and, on the other hand, to enable a minimal signal acquisition time when the output frequency is changed. Great demands are thus made on the loop filter, and these demands are inconsistent with each other. When the loop is locked, the cut-off frequency of the filter must be low so that the noise of the input signal will not appear as modulation at the output, whereas during the setting, where the output frequency is changed, the cut-off frequency of the loop must be high to enable a short signal acquisition time.

The information on whether the loop is locked or not is essential in most applications. Therefore, the loop is equipped with a so-called locking detector that generates an alarm signal when the loop is not in balance. One detector is disclosed e.g. in U.S. Pat. No. 4,135,165. The detector per se is beyond the scope of this invention.

The change of the frequency of the synthesizer is carried out in the way disclosed above by changing the division ratios of the loop divider consisting mostly of several dividers. The ratios are changed by means of software, that is the synthesizer is supplied with a code from outside the circuit, e.g. from a microprocessor, said code corresponding to certain division ratios. There are several embodiments. In one embodiment, which is also disclosed in U.S. Pat. No. 4,330,758, a code, which is also an address, is decoded by reading from the PROM memory the data corresponding to the division ratio, stored in the address, and conveying the data to the sample and hold circuit of data, from which it is fed to the divider at a given moment. If the operating voltage of the synthesizer circuit for some reason or another disappears, the data recorded in the sample and hold circuit will also disappear. In that case, upon switching the synthesizer on again, the entire process must be repeated for feeding the division ratios to the dividers.

Activating the synthesizer upon switching on the supply power is well known in the art. Instead, the problem lies in putting the synthesizer to sleep for a moment, i.e. deactivating and activating it, without the alarm circuit giving an unnecessary alarm. In such an equipment configuration in which the synthesizer is used only occasionally, it would be advantageous if it were possible to deactivate the synthesizer, i.e. to switch off the electricity from the synthesizer when it is not used. It would thus not consume electricity, or interfere with other electric circuits in the environment provided it were a high-frequency circuit. When the synthesizer is switched on again, it should be switched on rapidly, and not give an unnecessary alarm provided that locking takes place normally. An alarm would be harmful, as in several applications, many of the electric circuits of the device are bound with the frequency generated by the synthesizer, and, if the controlling processor receives an alarm from the synthesizer, the processor will give e.g. interrupt or wait commands to other circuits, and this, in turn, will slow down the operation of the entire equipment.

SUMMARY OF THE INVENTION

The aim of this invention is such a control circuit for the alarm of the synthesizer that does not give an unnecessary alarm "loop not locked" during the deactivated state. Deactivating is carried out by switching off the supply power from the synthesizer. Due to rapid progress of switching on, however, it is not possible to switch the power off from the loop divider and the feed circuits of the division ratio connected to it, since, as stated above, all the data related to division ratios would disappear, and the entire feeding process of the division ratios should be repeated. Instead, the supply power may be switched off from the voltage controlled oscillator VCO and the buffers possibly located in the loop. The specified aim of the invention is thus control of the VCO of the synthesizer, and of deactivating the buffers.

In accordance with the invention, two separate identification circuits are used. The information "loop locked/unlocked" obtained from the locking detector of the synthesizer provides the input of a first identification circuit. The output of the identification circuit changes its state with a delay in response to a state transition of the input. The delay is different in duration when the information of the input signal changes from the information "locked" into the information "unlocked", and when the information of the input signal changes from the information "unlocked" into "locked" The output of identification circuit I is a two-state signal, the first state being "no alarm blocking" and the second state "alarm blocking".

The information "supply power on/supply power off" providing the state of the operating voltage of the synthesizer provides the input of a second identification circuit. This identification circuit also changes its state with a delay in response to the state transition of the input, and the delay is different in duration depending on whether the state of the input changes from the information "supply power on" into the information "supply power off" or vice versa. The output of identification circuit II is a two-state signal, the first state being "identification circuit II alarming" and the second state being "identification circuit II not alarming".

The output signals of the identification circuits are compared in an element that generates the alarm signal, and provides "alarm of the synthesizer" as an output signal of the circuit only when the output of the first identification circuit is in state "no alarm blocking", and the output of the second identification circuit is in state "identification circuit II alarming" simultaneously. The basic idea of the invention is to set the delays of the first and the second identification circuit into different values, and, in particular, in an appropriate proportion to each other so that such an output signal is obtained for the circuit that does not give an alarm while the synthesizer is deactivated and activated, but, however, that gives an alarm when the signal acquisition time of the loop exceeds a predetermined time. This time is determined with one delay of the second identification circuit.

BRIEF DESCRIPTION OF THE DRAWINGS

In the following, the invention will be described in greater detail by means of a preferred embodiment in accordance with the invention, with reference to the attached drawings, in which.

DETAILED DESCRIPTION

Figure 1:
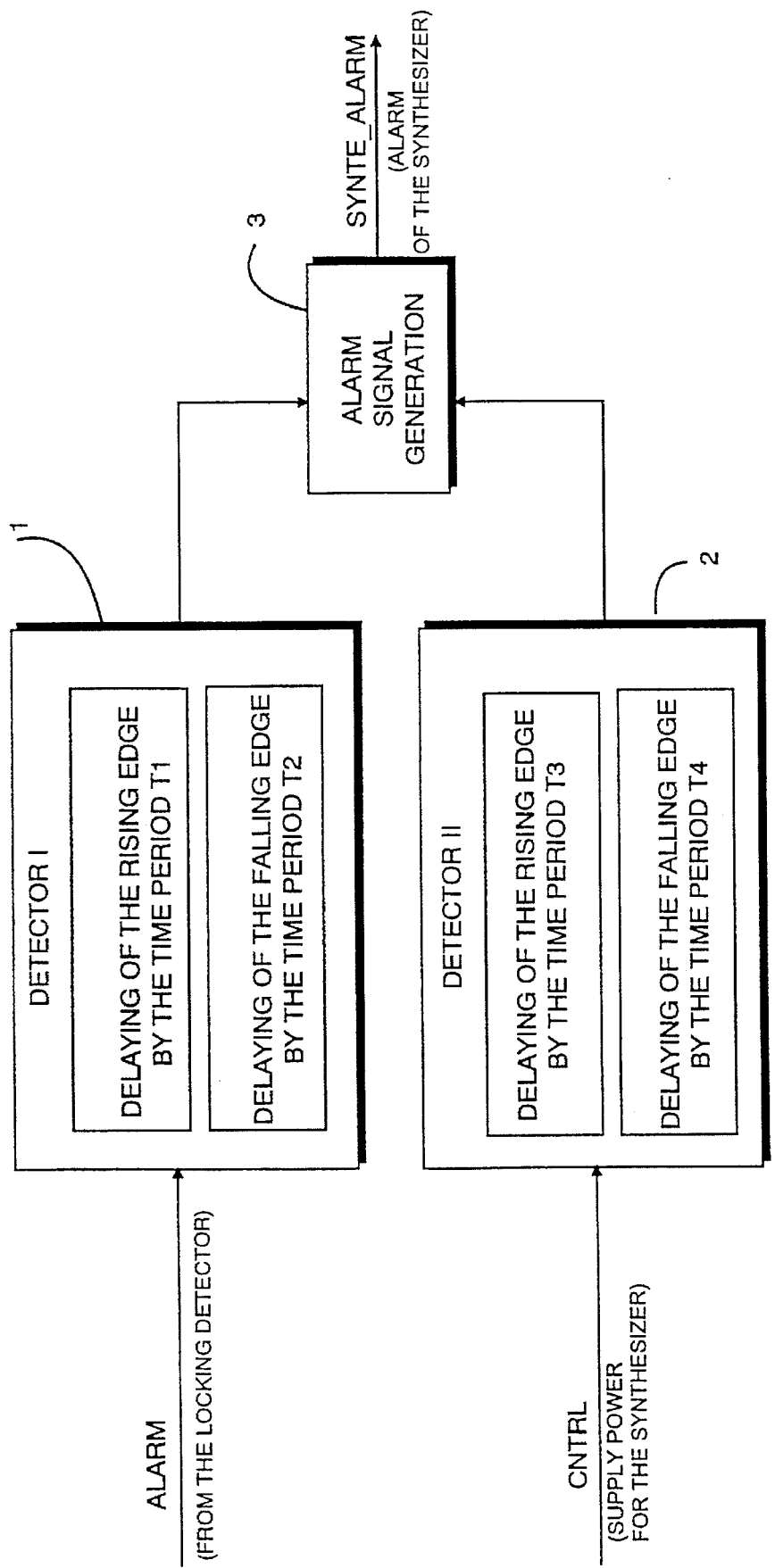
FIG. 1 is a block diagram illustrating the principle of the circuit of the invention.

In accordance with the principle of the invention shown in FIG. 1, two detectors are used, detector I and detector II. A signal LOCK ALARM obtained from the locking detector (not shown) of the synthesizer provides the input of detector I. This signal gives the information "locked" when the loop is locked, and the information "unlocked" when, subsequent to setting, the loop is not locked for some reason or another, or when locking is lost. Signal LOCK_ALARM is a two-state signal or staggered in threshold operation into two states. The state transitions of the input signal are hereinafter termed as edges. Detector I comprises a circuit for delaying the rising edge of the input signal at moment $T_1$ and for delaying the falling edge at moment $T_2$. The output of the detector is either signal "no alarm blocking" or signal "alarm blocking".

Correspondingly, signal CNTRL provides the input for detector II and gives the information on the state of the VCO and of the synthesizer and of the supply power of the buffers. This signal is also a two-state signal, or it is staggered in threshold operation into two-state information locked/unlocked. The state transitions are termed as edges, as above. The input of the detector may be connected directly to the supply power line of the VCO and the buffers. The detector comprises a circuit for delaying the rising edge of the input signal during $T_3$, and for delaying the falling edge during $T_4$. The information of the output signal of the detector is either "detector II not alarming" or "detector II alarming".

The outputs of the detectors are connected to a device 3 generating the alarm signal and providing either the alarm signal or signal "no alarm" as the output signal SYNTE_ALARM, depending on the state of the input signals, in a manner disclosed below.

Figure 2:
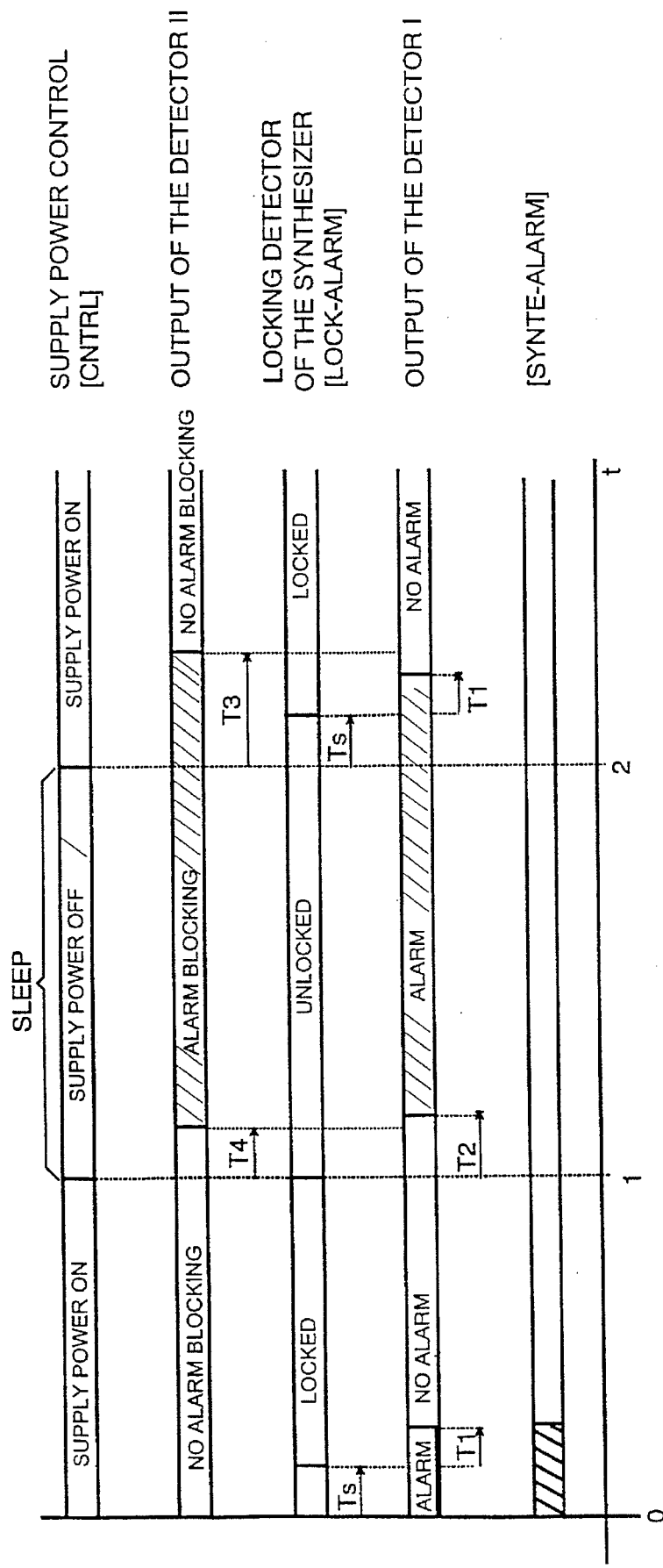
FIG. 2 illustrates the states of the inputs and the outputs of the detectors, as well as the state of the output of the circuit one below the other.

FIG. 2 shows the states of the inputs and the outputs of the detectors, and the state of the output of device 3 generating the alarm signal one below the other. The operation of the alarm circuit of the synthesizer is disclosed on the basis of this diagram. At moment 0 in time, the synthesizer is initialized by switching the power on by bringing signal CNTRL into state "supply power on". Simultaneously, the division ratios are fed into the loop divider. Signal LOCK_ALARM obtained from the locking detector of the synthesizer provides the information "unlocked", as the phase-locked loop has not yet been locked. After the locking time Ts, the loop is locked, and signal LOCK_ALARM changes its state into state "locked". Detector I, which has allowed the signal to 'alarm' until the current moment, detects the state transition i.e. the edge of signal LOCK_ALARM, as a result of which the output signal of the detector changes its state after delay time T1 from said edge. The state changes into state "not alarming". Simultaneously, the identification circuit has detected that the supply power is on, as a result of which the state of the output signal of the circuit gives the information "no alarm blocking". During the whole time period 0 ... 1, identification circuit II is in state "no alarm blocking", identification circuit I is at the beginning of said time period in state "alarming", but once the synthesizer has been set, it remains in state "not alarming" for the rest of the time period. The device generating the alarm signal examines the state of the outputs of both of the identification circuits and detects that identification circuit II does not set alarm blocking. Then the device generating the alarm signal sets the output signal SYNTE_ALARM of the circuit into the alarming state at the beginning of the time period, when the loop of the synthesizer is setting.

For the time period 1–2, the synthesizer is deactivated by switching off the supply power with signal CNTRL. The state transition, or the edge of signal CNTRL taking place at moment 1 appears with a delay after time T4 as a state transition of the output of identification circuit II from state "no alarm blocking" into state "alarm blocking". At moment 1 in time, signal LOCK_ALARM indicating the locking state of the synthesizer changes into the state "unlocked", said change (edge) appearing after delay time T2 at the output of identification circuit I. Identification circuit I now gives an alarm, but, as T4<T2, the state of identification circuit II has changed into state "alarm blocking" a moment before. As a result, the alarm generated by identification circuit I noes not appear in the output signal SYNTE_ALARM of the device generating the alarm signal. An alarm thus does not take place within the time period 1–2, although the synthesizer has been deactivated. It is necessary, however, that T4<T2.

At moment 2 in time, the supply power is switched on at the synthesizer with signal CNTRL. Signal LOCK_ALARM changes its state after the locking time Ts of the loop, after which time delay time T1 must pass, and only after this, identification circuit I changes its state from state "alarming" into state "not alarming". Device 3 generating the alarm signal does not, however, set its output SYNTE_ALARM into the alarming state after switching the power on, as the state of the identification circuit II changes from state "alarm blocking" into state "no alarm blocking" even later, that is, after delay time T3. This delay time T3 is longer than the setting time of the synthesizer Ts+delay time T1. An alarm thus does not take place due to switching the power on. However, it necessary that T3 Ts+T1. If the synthesizer is not set within time T3, an alarm takes place as supposed. Simultaneously when T3 is set, the time is thus set after the duration of which an alarm is made if locking fails.

The operation of the circuit in accordance with the invention is disclosed above generally. The circuit that implements the disclosed operation may be constructed in a variety of ways, both analog and digital.

Figure 3:
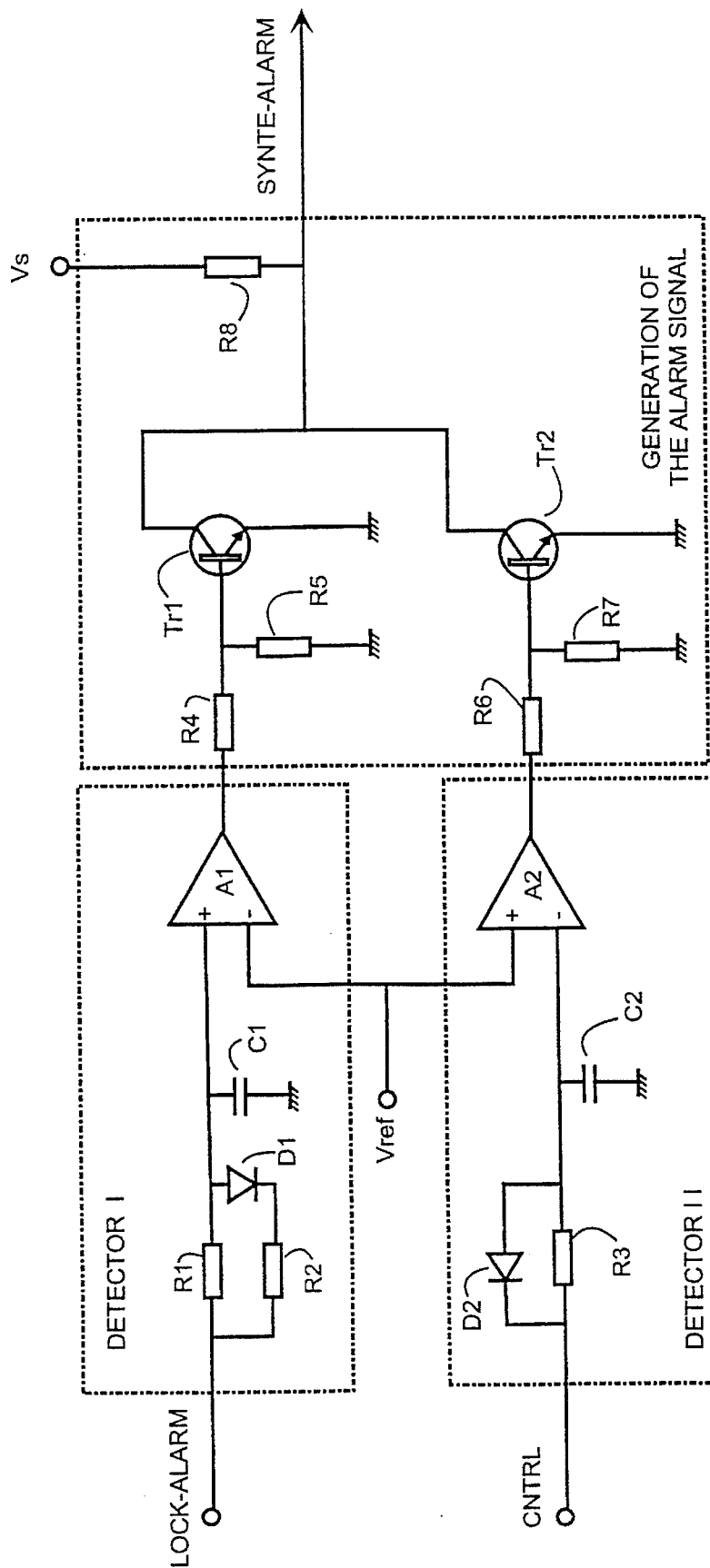
FIG. 3 shows one preferred embodiment.

FIG. 3 shows a possible analog implementation. Identification circuit I comprises comparator A1, the inverting input of which is connected to a positive reference voltage Vref. Signal LOCK_ALARM obtained from the locking detector of the synthesizer via an RC circuit formed by the series resistance and the shunt capacitance has an effect on the non-inverting input. If LOCK_ALARM is positive, the RC circuit is composed of resistor R2 and capacitor C1, and the time constant of the circuit is T1. When LOCK_ALARM is smaller than Vref, e.g. 0 V or a negative value, the RC circuit is composed of resistor R2 and capacitor C1, the time constant of the circuit being T2. Correspondingly, identification circuit II comprises comparator A2, the non-inverting input of which is connected to a positive reference voltage Vref. The switching signal CNTRL of the supply power of the synthesizer has an effect on the inverting input. When the supply power is switched on, the switching signal has a positive value, which is higher than Vref. Then the voltage at the input of the comparator rises at the rate determined by the time constant T3 of the R3 C2 circuit. Correspondingly, when the supply power is switched off, CNTRL being smaller than Vref, the capacitor discharges through diode D2. The time constant is then T4.

The device generating the alarm signal comprises switch transistors Tr1 and Tr2, as well as a pull-up resistor R8.

The operation is as follows: Upon initializing the synthesizer, CNTRL is high, e.g. 5 V. The VCO is then supplied with the supply power, and it starts to oscillate. The output of the comparator of identification circuit II is low, and Tr2 is thus in the non-conducting state. The output LOCK_ALARM of identification circuit of locking is low, e.g. 0 V, which indicates that the synthesizer is not locked. Then the output of comparator A1 of the identification circuit is low, and Tr1 is thus in the non-conducting state. The output voltage SYNTE_ALARM of the device generating the alarm signal is high, which indicates the alarm of the synthesizer. Once the data is fed to the synthesizer, it will be locked, and ALARM goes high. The change appears after time constant T1 at the output of comparator A1, when transistor Tr1 shifts into the conducting state, and the alarm is removed. Thereafter, the synthesizer is deactivated by switching off the supply power of the VCO, in other words, CNTRL goes low. The change appears after time constant T4 at the output of comparator A2, which changes to positive after time T4, whereby Tr2 goes into the conducting state. As the operating voltage disappears, the lock alarm LOCK_ALARM of the synthesizer goes low, whereby the output of comparator A1 goes low after delay time T2 (discharging along the path R2 C1). SYNTE_ALARM does not, however, give an alarm, since comparator A2 has changed its state before comparator A1, i.e. T4<T2, and thus identification circuit II prevents identification circuit I from causing an alarm.

When deactivation is terminated, the supply power is switched on to the VCO by lifting CNTRL high. Time constant T3 determines the time during which the synthesizer must be locked. This means that the output of comparator A1 must change its state before comparator A2 changes the state of its output and causes an alarm at the output of SYNTE_ALARM. The sum of delay time T1 of identification circuit I and the setting time Ts of the synthesizer must thus be smaller than delay time T3 of identification circuit II. If the synthesizer is not set during time T3, it will cause an alarm at the output of SYNTE_ALARM as supposed.

The synthesizer may thus be deactivated and reactivated repeatedly, without causing unnecessary alarms.

It should be understood that the above explanation and the figures attached thereto are only intended to illustrate the present invention. Different variations and modifications will be obvious for persons skilled in the art, without deviating from the scope and the spirit of the invention disclosed in the attached claims. The identification circuits may be separate, like in the circuit disclosed by way of an example, or the circuits may use common components. The device generating the alarm signal may be in digital applications a simple logic gate, the output of which is directly the alarm signal of the synthesizer.

I claim:

1. An alarm circuit for a synthesizer in which a locking detector signal of a phase-locked loop indicates in a first state that the loop is locked, and in a second state that the loop is unlocked, and for activating and temporary deactivating of which at least an operating voltage of a voltage controlled oscillator may be switched on in response to a first state of a switching signal of the operating voltage, and correspondingly, switched off in response to a second state of the switching signal, comprising:

a first detector, comprising a first means for changing the state of an output of the detector with a delay, in response to the change of the signal of the detector conveyed to said detector, a second detector, comprising a second means for changing the state of the output of the detector with a delay, in response to the change of the switching signal conveyed to said detector, and a device generating an alarm signal, providing an output signal of the alarm circuit in response to the output signal of the first detector and that of the second detector.

2. A circuit as claimed in claim 1, wherein:

the first means comprises a first delay means having a delay-time, and a second delay means having a delay-time, the state of the output of the first detector changes after the second delay-time, in response to the change of the signal of the detector from the first state into the second state, into a state in which the detector gives an alarm, and the state of the output of the detector changes after the first delay-time, in response to the change of the signal of the detector from the second state into the first state, into a state in which the detector does not give an alarm.

3. A circuit as claimed in claim 2, wherein:

the second means comprises a third delay means having a third delay-time, and a fourth delay means having a fourth delay-time, the state of the output of second detector changes after the fourth delay-time, in response to change of the switching signal of the operating voltage from the first state into the second state, into a state in which the detector prevents the device generating the alarm signal from giving an alarm, and the state of the output of the second detector changes after the third delay-time, in response to the change of the switching signal of the operating voltage from the second state into the first state, into a state in which the detector does not prevent the device generating the alarm signal from giving an alarm.

4. A circuit as claimed in claim 3 wherein:

the delay-time of the fourth delay means is longer than the delay-time of the second delay means, and the delay-time of the third delay means is longer than the sum of the delay-time of the first delay means and the setting time of the synthesizer, whereby the alarm circuit does not generate an alarm upon deactivating and activating the synthesizer.

5. A circuit as claimed in claim 4, wherein:

the first detector comprises a first and a second delay means, and a comparator, and the delay means is connected to the non-inverting input of said comparator, whereby, in response to the change of the locking signal of the synthesizer applied to the delay means, the output of the comparator changes its state with a delay.

6. A circuit as claimed in claim 3, wherein:

the second detector comprises a third and a second delay means, and a comparator, and the delay means is connected to the inverting input of said comparator, whereby, in response to the change of the switching signal of the operating voltage applied to the delay means, the state of the comparator changes its state with a delay.

7. A circuit as claimed in claim 5, wherein:

the device generating the alarm signal (comprising) comprises a first switch transistor controlled by the output signal of the first detector, and a second switch transistor controlled by the output signal of the second detector, whereby either of the transistors, when switched into the conductive state, prevents the device generating the alarm signal from giving an alarm.

* * * * *